(12) United States Patent
Yamaguchi et al.

(10) Patent No.: US 11,511,364 B2
(45) Date of Patent: Nov. 29, 2022

(54) FLUX COLLECTION METHOD AND FLUX COLLECTION APPARATUS

(71) Applicant: Panasonic Intellectual Property Management Co., Ltd., Osaka (JP)

(72) Inventors: Naoshi Yamaguchi, Osaka (JP); Koichi Nagai, Kyoto (JP); Yasuyuki Takano, Fukuoka (JP); Toshiro Kanda, Kyoto (JP)

(73) Assignee: PANASONIC INTELLETUAL PROPERTY MANAGEMENT CO., LTD., Osaka (JP)

( * ) Notice: Subject to any disclaimer, the term of this patent is extended or adjusted under 35 U.S.C. 154(b) by 962 days.

(21) Appl. No.: 16/274,126

(22) Filed: Feb. 12, 2019

(65) Prior Publication Data

US 2019/0388991 A1 Dec. 26, 2019

(30) Foreign Application Priority Data

Jun. 26, 2018 (JP) .............................. JP2018-121094

(51) Int. Cl.
*B23K 1/012* (2006.01)
*B23K 3/08* (2006.01)
*B03C 3/41* (2006.01)
*B01D 47/06* (2006.01)

(52) U.S. Cl.
CPC .............. *B23K 3/085* (2013.01); *B01D 47/06* (2013.01); *B03C 3/41* (2013.01); *B23K 1/012* (2013.01); *B03C 2201/06* (2013.01)

(58) Field of Classification Search
CPC ........... B03C 3/01; B03C 3/013; B03C 3/017; B03C 3/41; B03C 2201/06; B01D 47/06; B23K 3/085; B23K 1/012
See application file for complete search history.

(56) References Cited

U.S. PATENT DOCUMENTS

| 4,256,468 | A  | * | 3/1981 | Mazer | .................. B03C 3/00 |
|---|---|---|---|---|---|
| | | | | | 55/435 |
| 7,297,182 | B2 | * | 11/2007 | Ray | .................. B01D 47/06 |
| | | | | | 96/80 |
| 8,790,444 | B2 | * | 7/2014 | Ellis | .................. B03C 3/145 |
| | | | | | 95/71 |
| 9,731,299 | B2 | * | 8/2017 | Segawa | .................. B03C 3/06 |
| 10,695,713 | B2 | * | 6/2020 | Mizuoka | .................. B01D 53/30 |

(Continued)

FOREIGN PATENT DOCUMENTS

| CN | 104801420 | 7/2015 |
|---|---|---|
| JP | 2007-53158 | 3/2007 |

(Continued)

OTHER PUBLICATIONS

English Translation of Search Report dated Jun. 22, 2022 in Chinese Patent Application No. 201910125701.0.

*Primary Examiner* — Joseph C Rodriguez
(74) *Attorney, Agent, or Firm* — Wenderoth, Lind & Ponack, L.L.P.

(57) ABSTRACT

A method and an apparatus for collecting flux are disclosed. A rosin particle contained in an atmosphere gas, and a vapor of a solvent or an atomized solvent particle are mixed in a mixing section upstream of a flux collection unit-side inlet, and a gas containing a mixed particle is cleaned by electrostatic precipitation. The solvent particle adheres to the rosin particle, and forms an aggregate of larger particle size.

10 Claims, 12 Drawing Sheets

(56) References Cited

U.S. PATENT DOCUMENTS

| | | | |
|---|---|---|---|
| 11,148,217 B2* | 10/2021 | Yamaguchi | B23K 3/082 |
| 2003/0206843 A1* | 11/2003 | Nelson, Jr. | B01D 53/02 |
| | | | 423/210 |
| 2015/0013775 A1* | 1/2015 | Dash | G01F 1/58 |
| | | | 137/467.5 |
| 2016/0263585 A1* | 9/2016 | Filippelli | B01D 53/83 |
| 2019/0234342 A1* | 8/2019 | Saito | B23K 1/0016 |

FOREIGN PATENT DOCUMENTS

| | | | |
|---|---|---|---|
| JP | 4580590 B | | 11/2010 |
| JP | 4580590 B2 * | | 11/2010 |
| JP | 5366395 B | | 12/2013 |

* cited by examiner

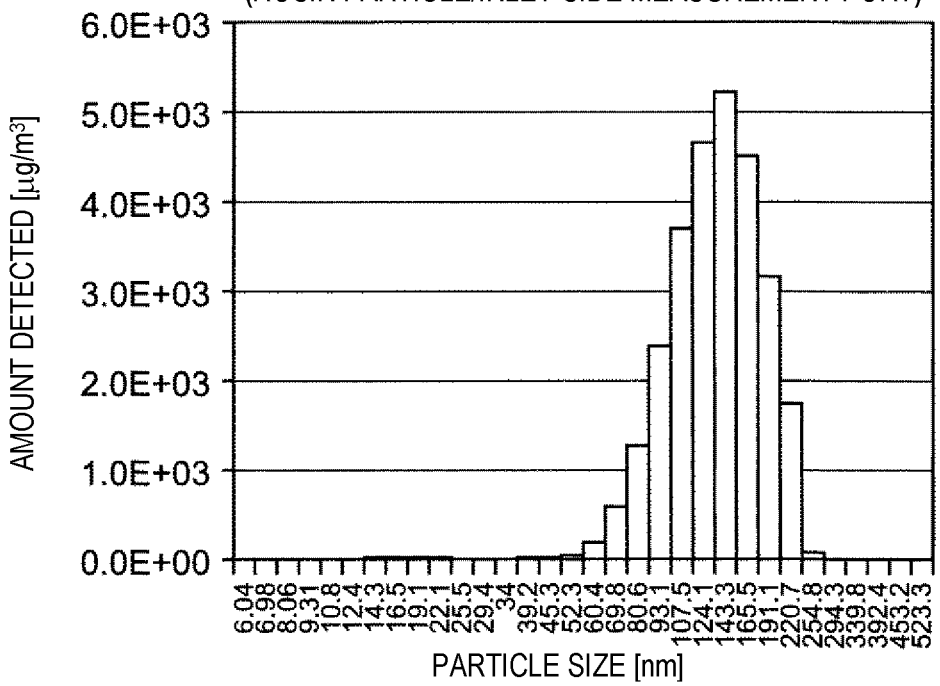
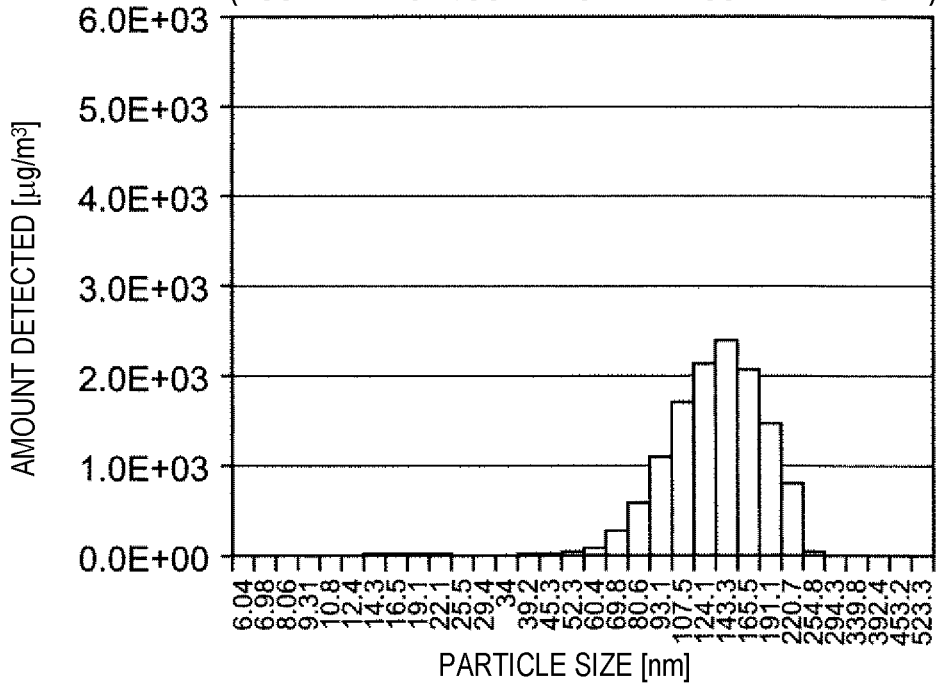

PARTICLE SIZE DISTRIBUTION
(MIXED PARTICLE/INLET-SIDE MEASUREMENT PORT)

PARTICLE SIZE DISTRIBUTION
(MIXED PARTICLE/OUTLET-SIDE MEASUREMENT PORT)

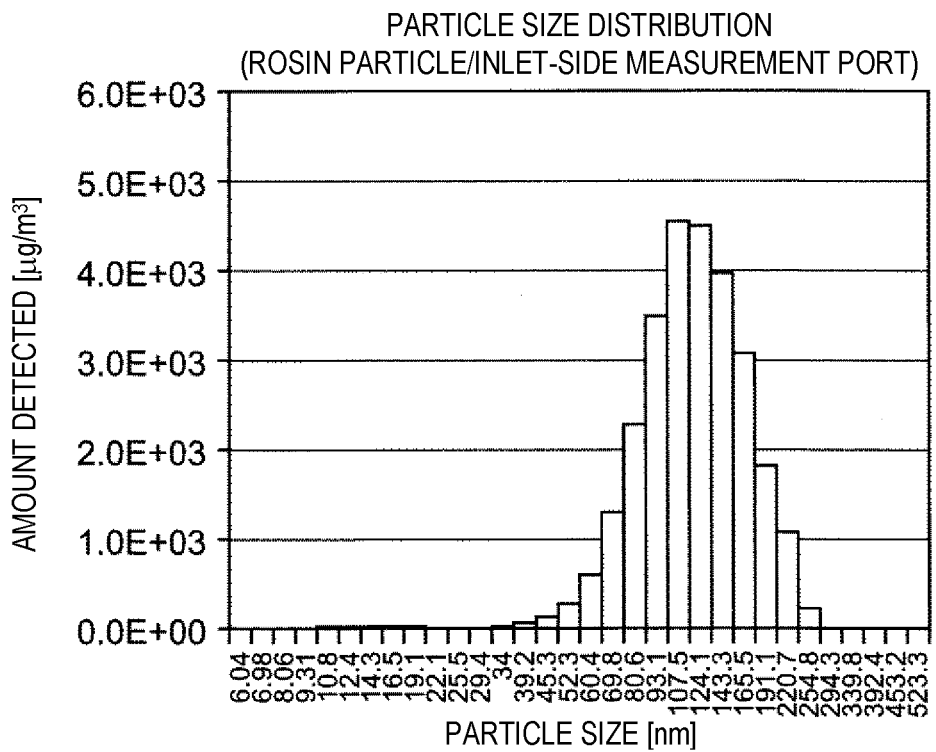

PARTICLE SIZE DISTRIBUTION
(MIXED PARTICLE/INLET-SIDE MEASUREMENT PORT)

PARTICLE SIZE DISTRIBUTION
(MIXED PARTICLE/OUTLET-SIDE MEASUREMENT PORT)

FIG. 5

| SOLVENT PARTICLE | EVALUATION ITEM | ROSIN PARTICLE | MIXED PARTICLE |
|---|---|---|---|
| 2-ETHYLHEXYL DIGLYCOL | MEDIAN PARTICLE SIZE | 143.3nm | 191.1nm |
| | FLUX COLLECTION RATE | 54% | 92% |
| | FLUX VISCOSITY | 121Pa·s | 23Pa·s |
| 2-(2-HEXYLOXYETHOXY) ETHANOL | MEDIAN PARTICLE SIZE | 107.5nm | 191.1nm |
| | FLUX COLLECTION RATE | 62% | 94% |
| | FLUX VISCOSITY | 111Pa·s | 54Pa·s |

FIG. 10

| | HEAT-EXCHANGE SCHEME | ELECTROSTATIC-PRECIPITATION SCHEME |
|---|---|---|
| MEASURED VALUE ON INLET SIDE (FLUX WEIGHT PER UNIT VOLUME) | 2630 $\mu g/m^3$ | 14100 $\mu g/m^3$ |
| MEASURED VALUE ON OUTLET SIDE (FLUX WEIGHT PER UNIT VOLUME) | 2380 $\mu g/m^3$ | 5610 $\mu g/m^3$ |
| FLUX COLLECTION RATE | 9.5% | 60.1% |
| FLUX VISCOSITY (ORDINARY TEMPERATURE) | 106Pa·s | 123Pa·s |

FLUX COLLECTION METHOD AND FLUX COLLECTION APPARATUS

TECHNICAL FIELD

The technical field relates to a method and an apparatus for collecting flux in a reflow furnace or in a flow vessel through collection of flux components from a flux component-containing gas.

BACKGROUND

Traditionally, soldering of electronic components to a circuit board uses an apparatus such as a reflow furnace and a flow vessel. For example, a reflow furnace is configured from a preheat zone in which volatiles, mainly solvent, vaporize from the solder paste applied to a circuit board; a primary heat zone, a goal of which is to evaporate the rosin component—a main component of the flux components, and to melt the solder powder; and a cooling zone, which is provided to solidify the solder, and to cool the circuit board itself. That is, soldering is a process in which a circuit board and electronic components are electrically joined to each other through thermal melting of the solder paste by passing the circuit board through a reflow furnace after applying the solder paste on the circuit board and mounting the electronic components on the paste.

Typically, soldering is accomplished in an atmosphere charged with inert gas or nitrogen, or in an air atmosphere.

In the solder paste applied to the circuit board and sent to the primary heat zone, the rosin component as a main component of the flux components evaporates inside the furnace in the form of rosin particles upon being exposed to high temperature. These rosin particles condense in relatively low-temperature portions inside the furnace, including, for example, a conveyer provided for transport of a circuit board into the furnace, inner wall surfaces of the furnace, the ceiling surface, a nozzle plate, a cooling plate, and the labyrinth. The rosin particles condensing on these parts of the furnace turn into a solid or a sticky rosin material as the temperature drops. Such a solid or sticky material causes problems when it clings to the constituent components of the reflow furnace in large quantity.

For example, when such a solid or sticky material is clinging to the conveyer in large quantity, the circuit board sticks to the conveyer, and cannot separate from the conveyer when exiting the furnace, causing it to be caught in the sprocket of the conveyer, and damaged. When the inner walls or the ceiling of the furnace have the solid or sticky material clinging to the surface in large quantity, the deposited fume solid may fall on the traveling circuit board, and stain the circuit board.

Various methods and apparatuses intended to remove the flux components in a furnace are proposed to overcome the problems caused by the clinging solid or sticky material.

For example, Japanese Patent No. 5366395 proposes an apparatus for collecting flux components. In this apparatus, the atmosphere gas generated in a reflow furnace is drawn into a flux collection unit installed outside of the furnace unit, and the atmosphere gas drawn into the flux collection unit is cooled by means of heat exchange to collect the flux components.

FIG. 8 is a diagram showing the reflow furnace on a cross section orthogonal to the transport direction of a circuit board. A flux collection unit 102 is installed in a zone where the atmosphere gas is contaminated most in a reflow furnace 101. A furnace-side outlet 103 for sending an atmosphere gas out of the reflow furnace 101 is connected to a collection unit-side inlet 104 of the flux collection unit 102. A furnace-side inlet 105 for introducing an atmosphere gas into the reflow furnace 101 is connected to a collection unit-side outlet 106 of the flux collection unit 102. A radiator 107 is installed in the flux collection unit 102 to cool the incoming atmosphere gas, and collect the flux components precipitating out of the atmosphere gas.

Japanese Patent No. 4580590 proposes an apparatus for collecting flux components. In this apparatus, the atmosphere gas generated in a reflow furnace is drawn into a flux collection unit installed outside of the furnace unit, and rosin particles are separated and removed from the atmosphere gas in the flux collection unit by means of electrostatic precipitation to collect the flux components.

FIG. 9 is a diagram showing the reflow furnace of Japanese Patent No. 4580590 on a cross section parallel to a direction perpendicular to the transport direction of the circuit board. A reflow furnace 201 is configured from a preheat zone 208 in which volatiles, mainly solvent, vaporize from the solder paste applied to a circuit board; a primary heat zone 209, a goal of which is to evaporate the rosin component—a main component of the flux components, and to melt the solder powder; and a cooling zone 210 provided to solidify the solder, and to cool the circuit board itself. In this related art, a furnace-side outlet 203, which leads to the flux collection unit 202, is provided between the cooling zone 210 and the primary heat zone 209, an area of the furnace contaminated most by the flux. The furnace-side outlet 203 is connected to a collection unit-side inlet 204 via a pipe or the like.

The flux collection unit 202 is configured from a corona discharge section 211, ground electrodes 212, and a fan 213. The atmosphere gas in the furnace is drawn into the flux collection unit 202 by the fan 213, and released to outside through a collection unit-side outlet 206.

The rosin particles generated in the reflow furnace become negatively charged by the corona discharge generated in the corona discharge section 211 as the atmosphere gas containing the rosin particles passes through the flux collection unit 202. The flux components are collected by trapping the charged rosin particles on the ground electrodes, that is, by attaching the charged rosin particles to the ground electrodes.

SUMMARY

However, the configurations of the related art have a low flux collection rate, and cannot achieve high cleanliness in the furnace. Another drawback is that, because of the high viscosity of the collected flux, the flux becomes immobile inside the flux collection unit, particularly under ordinary temperature conditions at around 30° C., and makes the flux collection unit not easily serviceable by itself.

To demonstrate, the present inventors installed an inlet-side measurement port 114 on the collection unit-side inlet 104 of the heat-exchange flux collection unit 102 shown in FIG. 8, and an inlet-side measurement port 214 on the collection unit-side inlet 204 of the electrostatic precipitation flux collection unit 202 shown in FIG. 9. Outlet-side measurement ports 115 and 215 were installed on the collection unit-side outlets 106 and 206, respectively. These ports were coupled to a real-time engine exhaust particle sizer EEPS 3090 available from TSI. The particle weight per unit volume of the atmosphere gas was then measured on the inlet side and the outlet side, and the flux collection efficiency was calculated from the difference. The viscosity of the collected flux components was also measured.

The results are presented in FIG. 10. The flux collection rate in the heat-exchange scheme was 9.5%, meaning that the remaining fraction of about 90% directly returns to the reflow furnace. The flux collection rate in the electrostatic precipitation scheme was 60.1%, higher than that observed in the heat-exchange scheme. However, about 40% still returns to the furnace, and it cannot be said that these methods have a reflow furnace cleaning effect. The collected fluxes had a viscosity in excess of 100 Pa·s. This means that the fluxes have almost no fluidity, and the flux components will probably stick to the walls and other surfaces in the flux collection unit.

The measured value on the inlet side was smaller in the heat-exchange scheme than in the electrostatic precipitation scheme. Setting the flux collection method aside, this is probably due to the structural difference in the way the gas is drawn in the reflow furnace. However, comparison of the flux collection rate alone is considered sufficient to gauge the difference between the two methods.

The present disclosure is intended to provide a solution to the foregoing problems of the related art, and it is an object of the present disclosure to provide a method and an apparatus for collecting flux in a way that improves the cleanliness inside a furnace by improving flux collection efficiency, and that reduces flux viscosity to maintain a liquid state even at ordinary temperature, and make the flux collection unit more easily serviceable.

According to an aspect of the disclosure, there is provided a method for collecting a flux in an atmosphere gas introduced into a flux collection unit from inside of a reflow furnace, the method including the steps of:

mixing a rosin particle contained in the atmosphere gas with vapor of a solvent or with an atomized solvent particle before the mixed particle enters a flux collection unit-side inlet; and collecting the mixed particle by means of electrostatic precipitation from a gas containing the mixed particle.

According to an aspect of the disclosure, there is provided a flux collection apparatus that includes:

an electrostatic-precipitation flux collection unit;

a first pipe with which an outlet through which an atmosphere gas is sent out of a reflow furnace is connected to an inlet through which the atmosphere gas from the outlet is sent into the flux collection unit; and a mixing section in which vapor of a solvent or an atomized solvent particle supplied into the first pipe between the outlet and the inlet is mixed with a rosin particle of the atmosphere gas to form a mixed particle.

The method and the apparatus for collecting flux according to the aspects of the disclosure above enable flux collection in a way that improves the cleanliness inside a furnace by improving flux collection efficiency, and that reduces flux viscosity to maintain a liquid state even at ordinary temperature, and make cleaning of the flux collection unit easier.

BRIEF DESCRIPTION OF THE DRAWINGS

FIG. 3A is a diagram representing a relationship between the particle size distribution of rosin particles on the inlet side before electrostatic precipitation (unit: nm), and the amount detected (unit: μg/m³) according to First Embodiment of the present disclosure.

FIG. 3B is a diagram representing a relationship between the particle size distribution of rosin particles on the outlet side after electrostatic precipitation (unit: nm), and the amount detected (unit: μg/m³) according to First Embodiment of the present disclosure.

FIG. 4A is a diagram representing a relationship between the particle size distribution of rosin particles on the inlet side before electrostatic precipitation (unit: nm), and the amount detected (unit: μg/m³) according to First Embodiment of the present disclosure.

FIG. 4B is a diagram representing a relationship between the particle size distribution of rosin particles on the outlet side after electrostatic precipitation (unit: nm), and the amount detected (unit: μg/m³) according to First Embodiment of the present disclosure.

FIG. 5 shows a table showing effects of First Embodiment of the present disclosure.

FIG. 10 shows a table of the comparison of flux collectability between a heat-exchange scheme and an electrostatic-precipitation scheme.

DESCRIPTION OF EMBODIMENTS

Embodiments of the present disclosure are described below, with reference to the accompanying drawings.

First Embodiment

Figure 1:
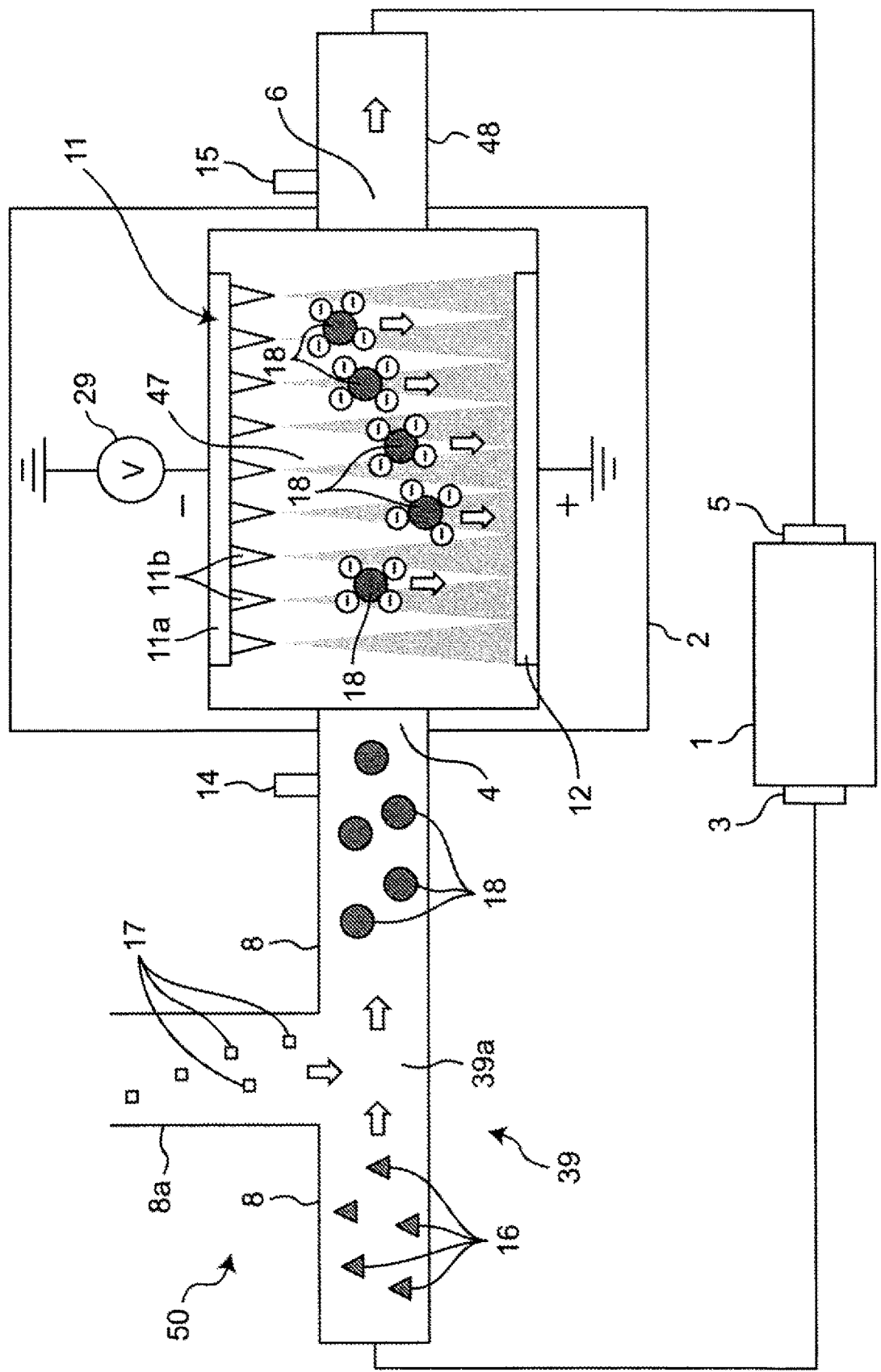
FIG. 1 is a diagram representing a flux collection method of First Embodiment of the present disclosure.

FIG. 1 is a diagram representing a flux collection method using a flux collection apparatus 50 of First Embodiment of the present disclosure. In FIG. 1, the flux collection apparatus 50 includes a flux collection unit 2, an inlet-side pipe 8, and a mixing section 39, among others.

The flux collection unit 2 is connected to a reflow furnace 1 via the inlet-side pipe 8. Specifically, the reflow furnace 1 has a furnace-side outlet 3 through which an atmosphere gas is sent out of the reflow furnace 1, and the pipe 8 connects the furnace-side outlet 3 to the collection unit-side inlet 4 of the flux collection unit 2. The furnace-side inlet 5 of the reflow furnace 1, through which the atmosphere gas is sent into the reflow furnace 1, is connected to a collection unit-side outlet 6 of the flux collection unit 2 via an outlet-side pipe 48.

The mixing section 39 is disposed in the pipe 8 between the outlet 3 and the inlet 4. The mixing section 39 is where vapor of a solvent, or atomized solvent particles 17 are supplied, and mix with the atmosphere gas from the reflow furnace 1.

As an example, the mixing section 39 may be configured as a branching-pipe connecting section 39a where the pipe 8 connecting the outlet 3 to the inlet 4 joins a branching pipe 8a that crosses (for example, orthogonally) the central axis of the pipe 8, as shown in FIG. 1. In the branching-pipe connecting section 39a, the atmosphere gas generated in the reflow furnace 1 and containing rosin particles 16 mixes with a gas containing solvent particles 17 as the solvent particle-containing gas traveling through the branching pipe 8a flows into the atmosphere gas running inside of the pipe 8 from the outlet 3 toward the inlet 4.

Figure 2:
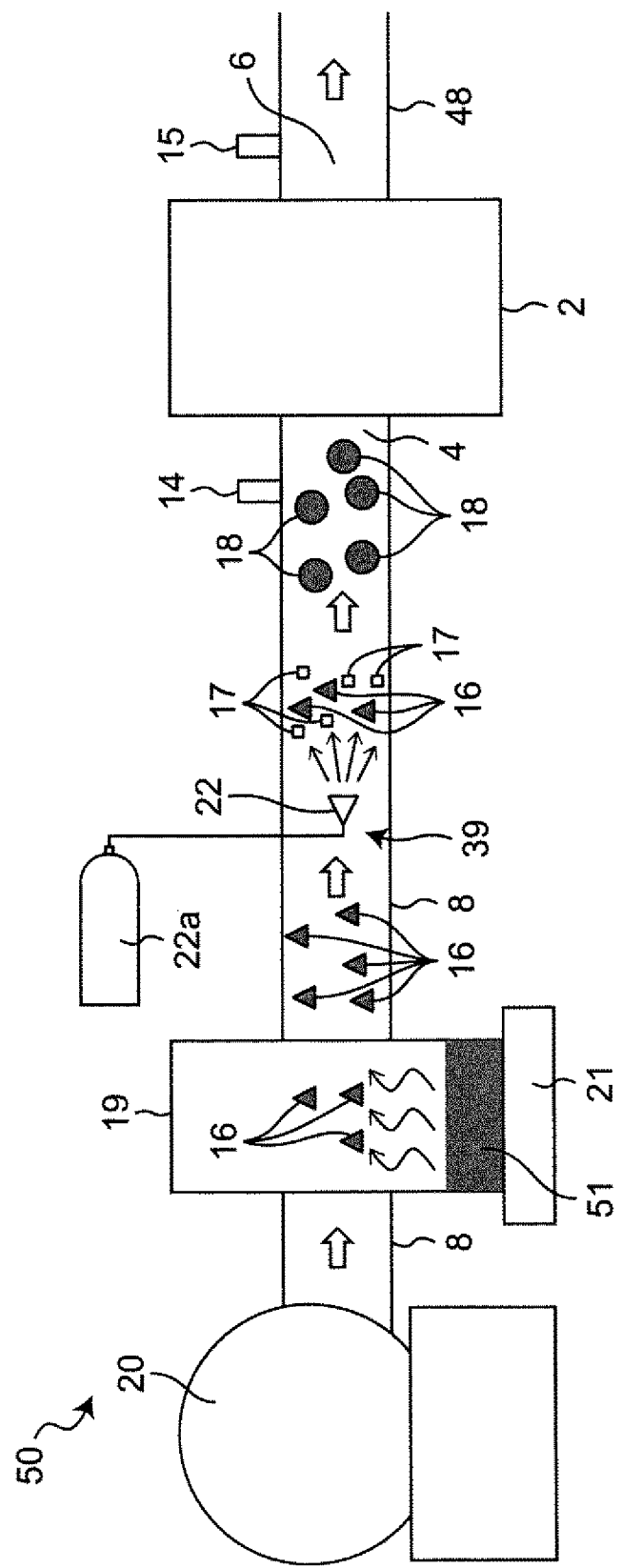
FIG. 2 is a diagram representing an experiment apparatus of First Embodiment of the present disclosure.

As another example, the mixing section 39 may be configured as a spray 22 disposed in the pipe 8 connecting the outlet 3 to the inlet 4, as shown in FIG. 2. In this case, the atmosphere gas generated in the reflow furnace 1 and containing rosin particles 16 mixes with a gas containing solvent particles 17 as the spray 22 ejects the solvent particle-containing gas from a tank 22a into the atmosphere gas running inside of the pipe 8 from the outlet 3 toward the inlet 4.

In FIG. 1, the flux collection unit 2 includes parallel plate electrodes 11a and 12. The parallel plate electrodes 11a and 12 are configured from a corona discharge section 11 and a ground electrode 12. The corona discharge section 11 includes needle-like electrodes 11b provided on the surface of a metal plate 11a facing the ground electrode 12. The ground electrode 12 is a metal plate similarly to the plate 11a, and faces the plate 11a. Between the parallel plate electrodes 11a and 12 is a space 47 where a stream of air passes through. Applying a high negative voltage to the corona discharge section 11 from a power supply 29 causes the needle-like electrodes 11b to generate corona discharge at the needle ends toward the ground electrode 12. Here, the parallel plate electrodes 11a and 12 have a high potential difference. Because of the high potential difference between the parallel plate electrodes 11a and 12, the particles 18 contained in the gas are attracted to the ground electrode 12 as soon as the particles 18 become negatively charged in the gas passing through the space 47 between the parallel plate electrodes 11a and 12. These particles 18 attach to the ground electrode 12, and deposit thereon for collection. The ground electrode 12 and the corona discharge section 11 may be made of any metallic material, provided that it is conductive. For example, materials typically used for structural members may be used, including, copper, aluminum, stainless steel, and brass.

A feature of the flux collection method of First Embodiment is that the atmosphere gas generated in the reflow furnace 1 and containing rosin particles 16 mixes with the gas containing solvent particles 17 in the mixing section 39 provided upstream of the collection unit-side inlet 4 in the pipe 8. Mixing of the rosin particles 16 and the solvent particles 17 in the mixing section 39 inside the pipe 8 forms mixed particles 18 as a mixture of the rosin particles 16 and the solvent particles 17. The mixed particles 18 form as a result of aggregation of the rosin particles 16 and the solvent particles 17, or dissolving of the rosin particles 16 in the solvent particles 17, and are larger than the rosin particles 16.

The present inventors conducted a comparative experiment for flux collection rate using two methods, as follows. In a first method, hot air containing rosin particles 16 generated from vaporized rosin was solely passed through the flux collection unit 2, and the rosin particles 16 were collected by means of electrostatic precipitation. In a second method, solvent particles 17 were generated, and mixed with rosin particles 16 in the mixing section 39 upstream of the collection unit-side inlet 4 to form mixed particles 18, and the mixed particles 18 were collected by means of electrostatic precipitation through the flux collection unit 2.

An inlet-side measurement port 14 was installed on the collection unit-side inlet 4 of the flux collection unit 2. An outlet-side measurement port 15 was installed on the collection unit-side outlet 6. These ports 14 and 15 were coupled to a real-time engine exhaust particle sizer EEPS 3090 available from TSI. The particle weight per unit volume of the atmosphere gas was then measured on the inlet side. On the outlet-side, the particle weight and the particle size distribution were measured for particles contained in per unit volume of the atmosphere gas. The flux collection rate was calculated from the difference. The viscosity of the collected flux components was also measured.

In the comparative experiment, the type of solvent particles 17 was selected by focusing on the following points.
Requirement (1)
The solvent particles need to be highly compatible with the rosin component. That is, the solvent particles need to be a solvent that dissolves the rosin component.
Requirement (2)
The solvent particles need to be a solvent that can be easily charged by corona discharge. That is, the solvent particles need to be a polar protic solvent (a solvent having a hydrogen bond in the molecular structure).
Requirement (3)
The solvent particles need to be a solvent having a flash point above the temperature of the gas containing the rosin particles.

Requirements (1) and (2) are important for the flux viscosity reducing effect of First Embodiment, and for improving flux collection efficiency by corona discharge. Requirement (3) is important for eliminating the risk of explosion when the rosin particle-containing gas is accidentally mixed with a gas containing solvent particles having a flash point below the temperature of the rosin particle-containing gas.

With these requirements in mind, the present inventors conducted experiments by using 2-ethylhexyl diglycol and 2-(2-hexyloxyethoxy) ethanol as examples of the solvent particles 17 satisfying requirements (1) to (3). These solvents are merely examples, and any solvent may be selected that satisfies the foregoing requirements (1) to (3).

FIG. 2 is a diagram representing an experiment apparatus of First Embodiment of the present disclosure. As shown in FIG. 2, in order to cause vaporization of the rosin component and generate rosin particles 16, a hot air generator 20 was connected to the reflow-furnace end of the pipe 8 shown in FIG. 1, instead of the reflow furnace, and a container 19 was installed in a part of the path of the pipe 8. With the container 19 containing rosin 51, the hot air generator 20 generated 150° C. hot air at a rate of 1 m$^3$/min, and the rosin 51 was heated to 200° C. to 300° C. with a heater stage 21 provided at the bottom of the container 19 to generate rosin particles 16 inside the container 19.

A 90.0% dehydroabietic acid product available from FUJIFILM Wako Pure Chemical Corporation was used as the rosin. With regards to physical properties, the rosin had a melting point of 172° C., and turned into a gas at a temperature of about 200° C. to 400° C. The rosin particles 16 were generated under the foregoing conditions to simulate the temperature in the primary heat zone of the actual reflow furnace, and the flow rate of the gas actually introduced into the flux collection unit 2.

In order to generate solvent particles 17, the spray 22 that functions as an example of the mixing section 39 was installed in a part of the path. From its installation position, the spray 22 ejected the solvent in the pipe 8 while the solvent temperature was being adjusted not to exceed the flash point. The solvent becomes vapor containing atomized solvent particles 17 as soon as it is sprayed, and forms the mixed particles 18 by mixing with the rosin particles 16.

The spray 22 ejected the solvent in adjusted amounts so that the rosin particles 16 and the solvent particles 17 had a weight ratio of about 4:1 upon formation.

Figures 3C, 3D:
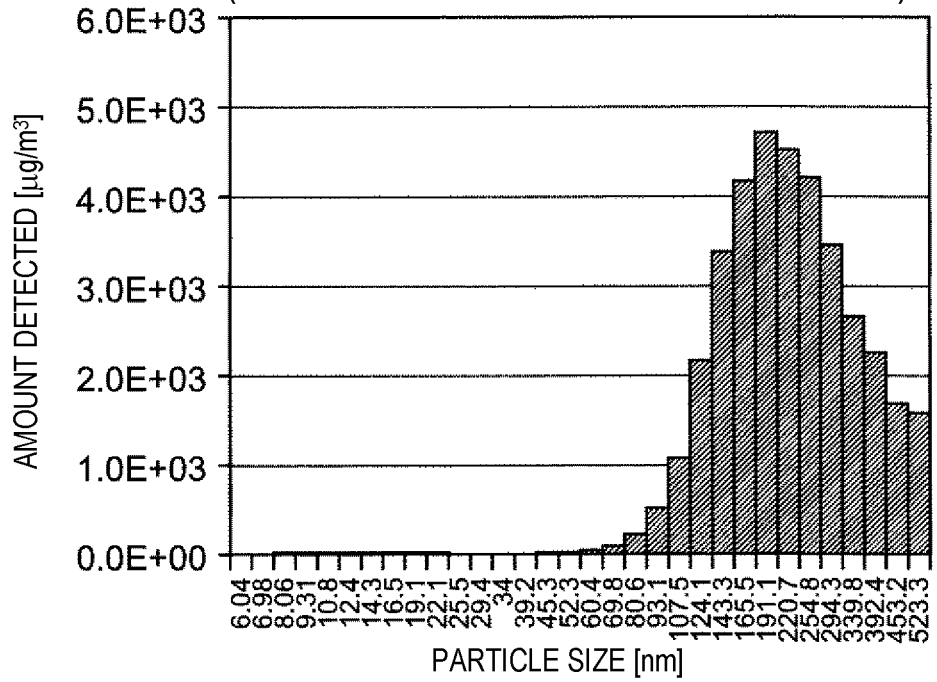
FIG. 3C is a diagram representing a relationship between the particle size distribution of mixed particles on the inlet side before electrostatic precipitation (the solvent is 2-ethylhexyl diglycol; unit: nm), and the amount detected (unit: μg/m³) according to First Embodiment of the present disclosure.
FIG. 3D is a diagram representing a relationship between the particle size distribution of mixed particles on the outlet side after electrostatic precipitation (the solvent is 2-ethylhexyl diglycol; unit: nm), and the amount detected (unit: μg/m³) according to First Embodiment of the present disclosure.

FIGS. 3A to 3D, and FIGS. 4A to 4D represent the results of the comparison of particle size distributions in the experiment conducted in the manner described above. FIGS. 3C and 3D represent the results of the experiments that used 2-ethylhexyl diglycol as the solvent.

FIGS. 3A and 3B represent the results of the measurements in which the rosin particles 16 were introduced alone into the electrostatic-precipitation flux collection unit 2, and measured for particle size distribution at the inlet-side measurement port 14 (FIG. 3A) and the outlet-side measurement port 15 (FIG. 3B). Specifically, FIG. 3A is a diagram representing a relationship between the particle size distribution of rosin particles 16 on the inlet side before electrostatic precipitation (unit: nm), and the amount detected (unit: µg/m$^3$). FIG. 3B is a diagram representing a relationship between the particle size distribution of rosin particles 16 on the outlet side after electrostatic precipitation (unit: nm), and the amount detected (unit: µg/m$^3$). As can be seen, the particles measured at the inlet-side measurement port 14 have a median particle size of 143.3 nm. From the particle size distribution measured at the outlet-side measurement port, the particle weight per unit volume of the gas was calculated on the inlet side and the outlet side, and the difference was calculated. The calculations revealed that the collection rate of the electrostatic-precipitation collection of the rosin particles 16 alone was 54%.

FIGS. 3C and 3D represent the results of the measurements in which the solvent was ejected in the pipe 8 from the spray 22, and the solvent particles 17 were mixed with the rosin particles 16 to form mixed particles 18, which were then introduced into the electrostatic-precipitation flux collection unit 2, and measured for particle size distribution at the inlet-side measurement port 14 (FIG. 3C) and the outlet-side measurement port 15 (FIG. 3D). FIG. 3C is a diagram representing a relationship between the particle size distribution of mixed particles 18 on the inlet side before electrostatic precipitation (the solvent is 2-ethylhexyl diglycol; unit: nm), and the amount detected (unit: µg/m$^3$). FIG. 3D is a diagram representing a relationship between the particle size distribution of mixed particles 18 on the outlet side after electrostatic precipitation (the solvent is 2-ethylhexyl diglycol; unit: nm), and the amount detected (unit: µg/m$^3$). As can be seen, the particles measured at the inlet-side measurement port 14 have a median particle size of 191.1 nm. That is, the median of the particle size distribution of the rosin particles 16 is smaller than the median of the particle size distribution of the mixed particles 18. From the particle size distributions measured at the outlet-side measurement port 15 and the inlet-side measurement port, the particle weight per unit volume of the gas was calculated on the inlet side and the outlet side, and the difference was calculated. The calculations revealed that the collection rate of the electrostatic-precipitation collection of the mixed particles 18 was 92%.

Figure 4C:
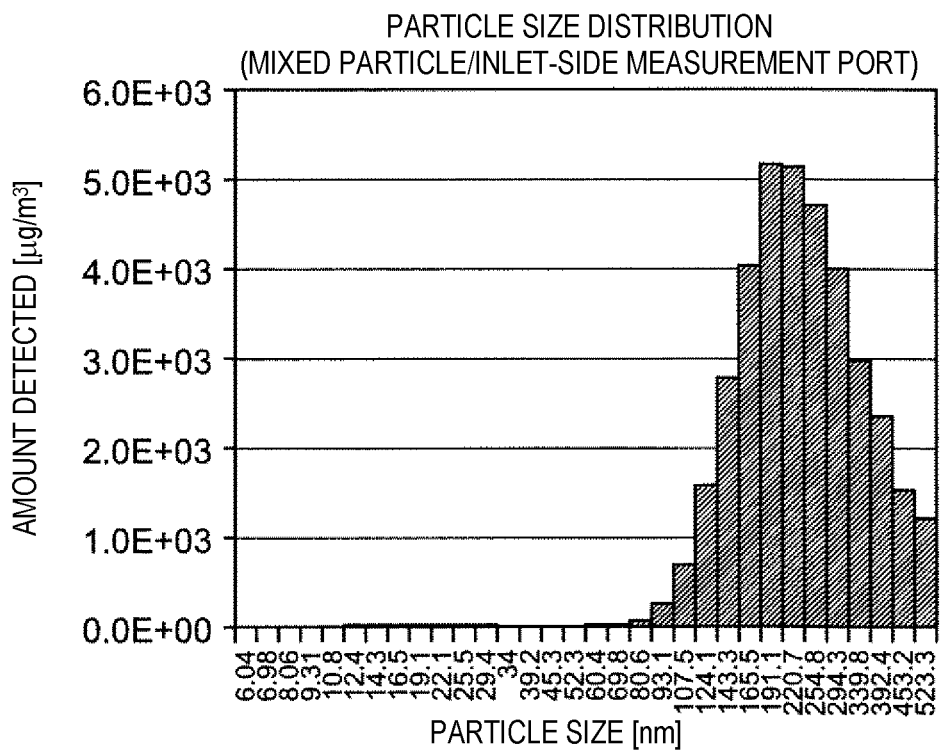
FIG. 4C is a diagram representing a relationship between the particle size distribution of mixed particles on the inlet side before electrostatic precipitation (the solvent is 2-(2-hexyloxyethoxy)ethanol; unit: nm), and the amount detected (unit: μg/m³) according to First Embodiment of the present disclosure.
Figure 4D:
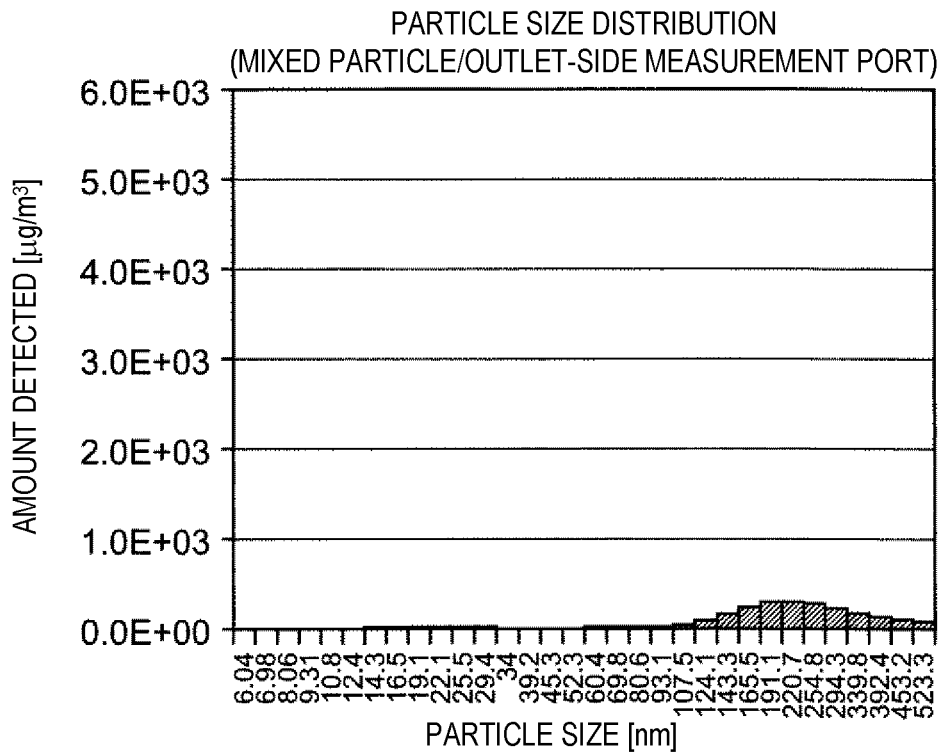
FIG. 4D is a diagram representing a relationship between the particle size distribution of mixed particles on the outlet side after electrostatic precipitation (the solvent is 2-(2-hexyloxyethoxy)ethanol; unit: nm), and the amount detected (unit: μg/m³) according to First Embodiment of the present disclosure.

The same experiment was conducted with a different solvent, 2-(2-hexyloxyethoxy)ethanol, as shown in FIGS. 4C to 4D.

FIGS. 4A and 4B, which differ from FIGS. 3A and 3B, represent the results of the measurements in which the rosin particles 16 were introduced alone into the electrostatic-precipitation flux collection unit 2, and measured for particle size distribution at the inlet-side measurement port 14 and the outlet-side measurement port 15. Specifically, FIG. 4A, which differs from FIG. 3A, is a diagram representing a relationship between the particle size distribution of rosin particles 16 on the inlet side before electrostatic precipitation (unit: nm), and the amount detected (unit: µg/m$^3$). FIG. 4B, which differs from FIG. 3B, is a diagram representing a relationship between the particle size distribution of rosin particles 16 on the outlet side after electrostatic precipitation (unit: nm), and the amount detected (unit: µg/m$^3$). As can be seen, the particles measured at the inlet-side measurement port 14 have a median particle size of 107.5 nm. From the particle size distribution measured at the outlet-side measurement port 15, the particle weight per unit volume of the gas was calculated on the inlet side and the outlet side, and the difference was calculated. The calculations revealed that the collection rate of the electrostatic-precipitation collection of the rosin particles 16 alone was 62%.

FIGS. 4C and 4D represent the results of the measurements in which the solvent was ejected in the pipe 8 from the spray 22, and the solvent particles 17 were mixed with the rosin particles 16 to form mixed particles 18, which were then introduced into the electrostatic-precipitation flux collection unit 2, and measured for particle size distribution at the inlet-side measurement port 14 (FIG. 4C) and the outlet-side measurement port 15 (FIG. 4D). FIG. 4C is a diagram representing a relationship between the particle size distribution of mixed particles 18 on the inlet side before electrostatic precipitation (the solvent is 2-(2-hexyloxyethoxy)ethanol; unit: nm), and the amount detected (unit: µg/m$^3$). FIG. 4D is a diagram representing a relationship between the particle size distribution of mixed particles 18 on the outlet side after electrostatic precipitation (the solvent is 2-(2-hexyloxyethoxy)ethanol; unit: nm), and the amount detected (unit: µg/m$^3$). As can be seen, the particles measured at the inlet-side measurement port 14 have a median particle size of 191.1 nm. From the particle size distributions measured at the outlet-side measurement port 15, the particle weight per unit volume of the gas was calculated on the inlet side and the outlet side, and the difference was calculated. The calculations revealed that the collection rate of the electrostatic-precipitation collection of the mixed particles 18 was 94%.

FIG. 5 shows a table of comparison presenting the results from the foregoing experiments, along with the measured viscosity values of the collected flux. As can be seen from these results, with the suitably selected solvents, the mixed particles 18 of rosin particles 16 and solvent particles 17 have a larger particle size than the rosin particles 16, and, because the solvents are polar protic solvents, the flux collection rate has improved values of 90% or more. Further, as a result of dissolving of the rosin component in the solvent, the flux viscosity decreased to 60 Pa·s or less from 100 Pa·s or more, a value with which the flux has almost no fluidity. Here, a viscosity of 60 Pa·s or less is about the same as the viscosity of a soft solid hand cream, and the reduced flux viscosity is about the same as the viscosity of honey or a shampoo, which is fluidic.

The flux collection method described above is a method that includes the steps of:

mixing the rosin particles 16 contained in the atmosphere gas introduced into the flux collection unit 2 from inside of the reflow furnace 1 with vapor of a solvent or with atomized solvent particles 17 in the mixing section 39 provided upstream of the flux collection unit-side inlet 4; and cleaning the gas containing the mixed particles 18 mixed in the mixing section 39, by means of electrostatic precipitation.

By cleaning inside of the furnace using the flux collection method, the solvent particles 17 adhere to the rosin particles 16 contained in the atmosphere gas, and form aggregates that are larger than the rosin particles 16 and can be charged more easily. This improves the flux collection rate of the electrostatic-precipitation collection. Further, the rosin particles 16 dissolve in the solvent particles 17, and the collected flux can have reduced viscosity. That is, the method maintains the cleanliness inside the reflow furnace 1, and, at the same time, makes it easier to clean inside of the flux collection unit 2.

Figure 6:
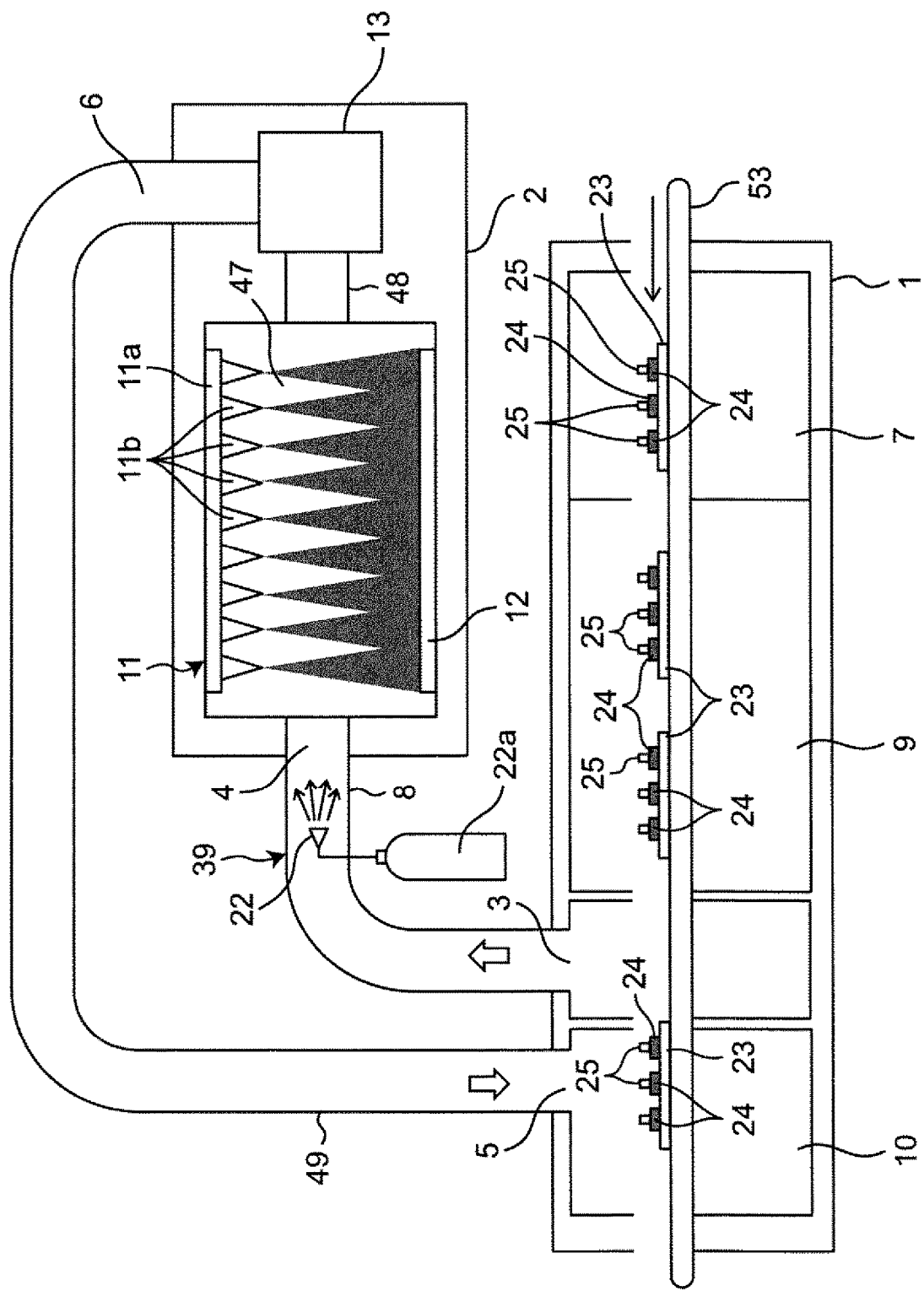
FIG. 6 is a diagram representing a structure of a flux collection apparatus as a variation of First Embodiment of the present disclosure.
Figure 8:
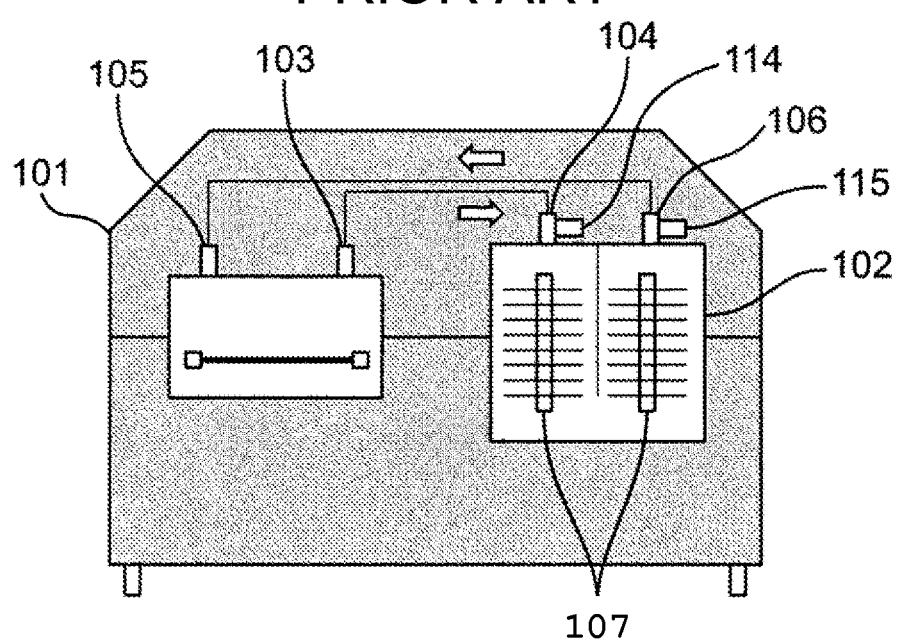
FIG. 8 is a diagram representing a flux collection apparatus of the related art described in Japanese Patent No. 5366395.
Figure 9:
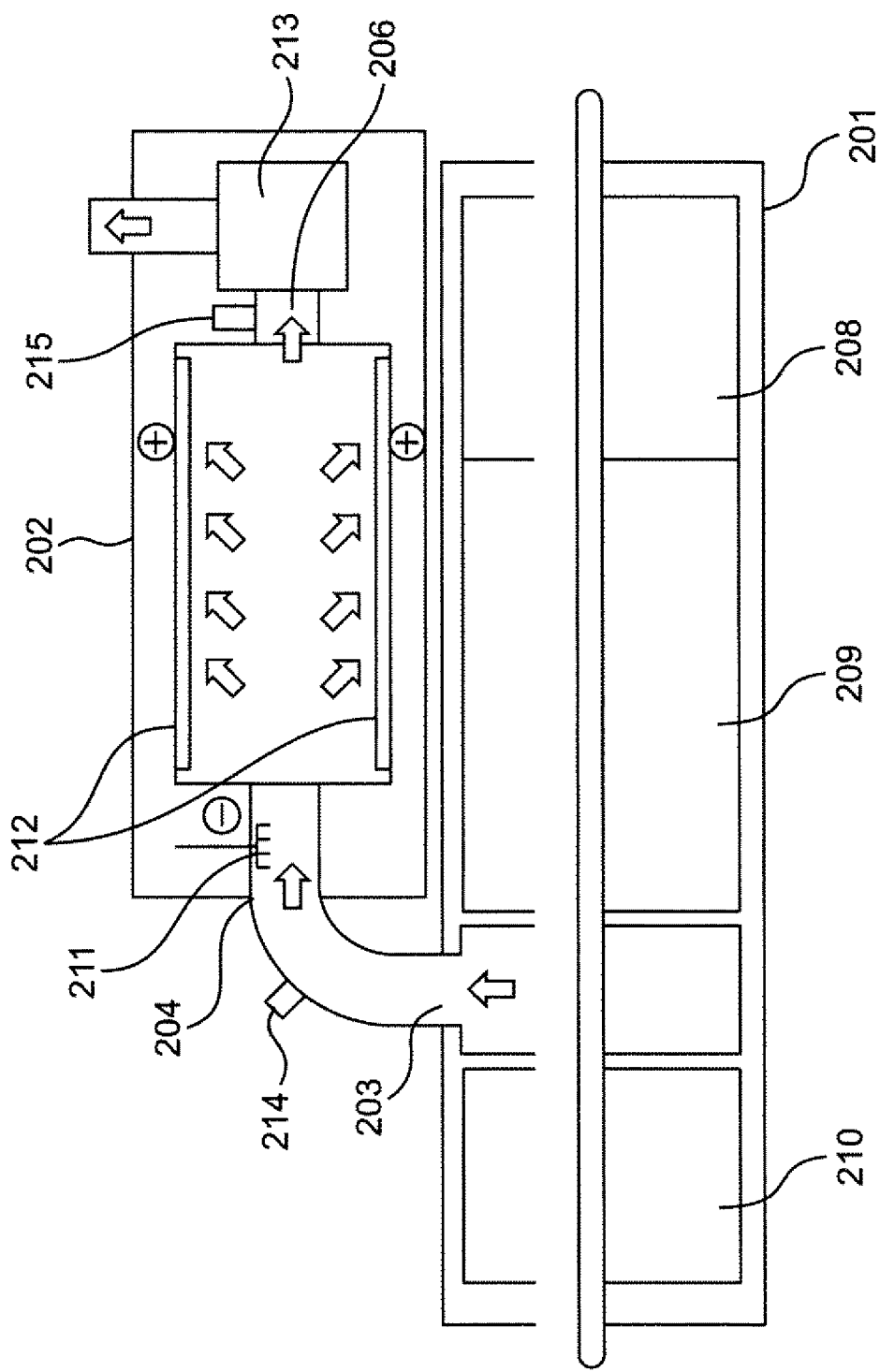
FIG. 9 is a diagram representing a flux collection apparatus of the related art described in Japanese Patent No. 4580590.

FIG. 6 is a diagram showing a flux collection unit 2 as a variation of First Embodiment of the present disclosure. In FIG. 6, the same constituting elements described in FIGS. 8 and 9 and in FIG. 1 will be referred to by the same reference numerals, and will not be described again.

A reflow furnace 1 is configured from a preheat zone 7, a primary heat zone 9, and a cooling zone 10. A circuit board 23 is shown with a solder paste 24 applied thereon at more than one location, and an electronic component 25 is mounted on the solder paste 24. The circuit board 23 is carried into the reflow furnace 1 by a conveyer 53, and passes through the preheat zone 7, the primary heat zone 9, and the cooling zone 10. The volatiles, mainly solvent, in the solder paste 24 applied to the circuit board 23 vaporize in the preheat zone 7. In the primary heat zone 9, the flux components vaporize and evaporate, and the solder powder melts. The solder solidifies in the cooling zone 10. After these processes, the electronic component 25 and the circuit board 23 become electrically joined to each other via the solder.

In the flux collection unit 2 as a variation of the First Embodiment of the present disclosure, the reflow furnace 1 and the electrostatic-precipitation flux collection unit 2 are connected to each other via pipes 8 and 48. The furnace-side outlet 3, which leads to the flux collection unit 2, is provided between the cooling zone 10 and the primary heat zone 9, an area of the furnace 1 contaminated most by the flux. The furnace-side outlet 3 is connected to a collection unit-side inlet 4 via the pipe 8. A furnace-side inlet 5 leading from the flux collection unit 2 is provided in the cooling zone 10. The furnace-side inlet 5 is connected to the collection unit-side outlet 6 via a pipe 49.

The flux collection unit 2 is configured to include a fan 13, in addition to the corona discharge section 11 and the ground electrode 12 of First Embodiment. The fan 13 draws the atmosphere gas inside the furnace 1 via the outlet-side pipe 48, the flux collection unit 2, and the pipe 8, and the atmosphere gas drawn into the fan 13 returns to the cooling zone 10 through the collection unit-side outlet 6, via the pipe 49.

Preferably, the furnace-side outlet 3 is installed basically in a portion of the furnace 1 contaminated most by the flux. In the present example, the furnace-side outlet 3 is installed between the primary heat zone 9 and the cooling zone 10. However, this is merely an example, and the position of the furnace-side outlet 3 is not limited to this. The furnace-side inlet 5 is installed in the cooling zone 10. This is to avoid the potential risk that the atmosphere gas, when discharged out of the furnace 1 such as into outside air, may cause influx of the same amount of atmosphere gas through the substrate entry and exit openings of the reflow furnace 1, and lower the temperature inside the furnace 1. This is even more problematic when the atmosphere inside the reflow furnace 1 is nitrogen, and ambient air is drawn into the furnace 1. Desirably, the furnace-side inlet 5 is disposed closer to the furnace-side outlet 3. However, this is merely an example, and the position of the furnace-side inlet 5 is not limited to this.

A feature of the variation of First Embodiment of the present disclosure is that the spray 22 is installed between the furnace-side outlet 3 and the collection unit-side inlet 4, and functions to spray solvent, as an example of the mixing section 39.

The flux collection unit 2, which collects flux by means of electrostatic precipitation, is configured so that the outlet 3, through which the atmosphere gas is sent out of the reflow furnace 1, is connected via the pipe 8 to the inlet 4 through which the atmosphere gas is introduced into the flux collection unit 2, and that a mechanism is provided that sprays solvent in the pipe between the outlet and the inlet. In this way, the rosin particles 16 contained in the atmosphere gas can mix with a solvent vapor or with atomized solvent particles 17 in the mixing section 39 provided upstream of the flux collection unit-side inlet 4, and produce mixed particles 18 in the mixing section 39. Because the mixed particles 18 are aggregates of large particle size that can be charged more easily, the flux collection rate of the electrostatic-precipitation collection improves, and, because the rosin particles 16 dissolve into the solvent particles 17, the collected flux has reduced viscosity. In this way, the reflow furnace 1 can remain clean inside, and, at the same time, it becomes easier to clean inside of the flux collection unit 2.

As is evident, the rosin particles 16, the solvent particles 17, and the mixed particles 18 described in First Embodiment may each represent a single particle, or a plurality of particles.

With the foregoing First Embodiment and the variation of First Embodiment, the cleanliness inside the furnace 1 can improve with the improved flux collection rate, and the flux can remain as liquid even at ordinary temperature because of reduced viscosity, making it easier to clean the flux collection unit 2.

Second Embodiment

Figure 7:
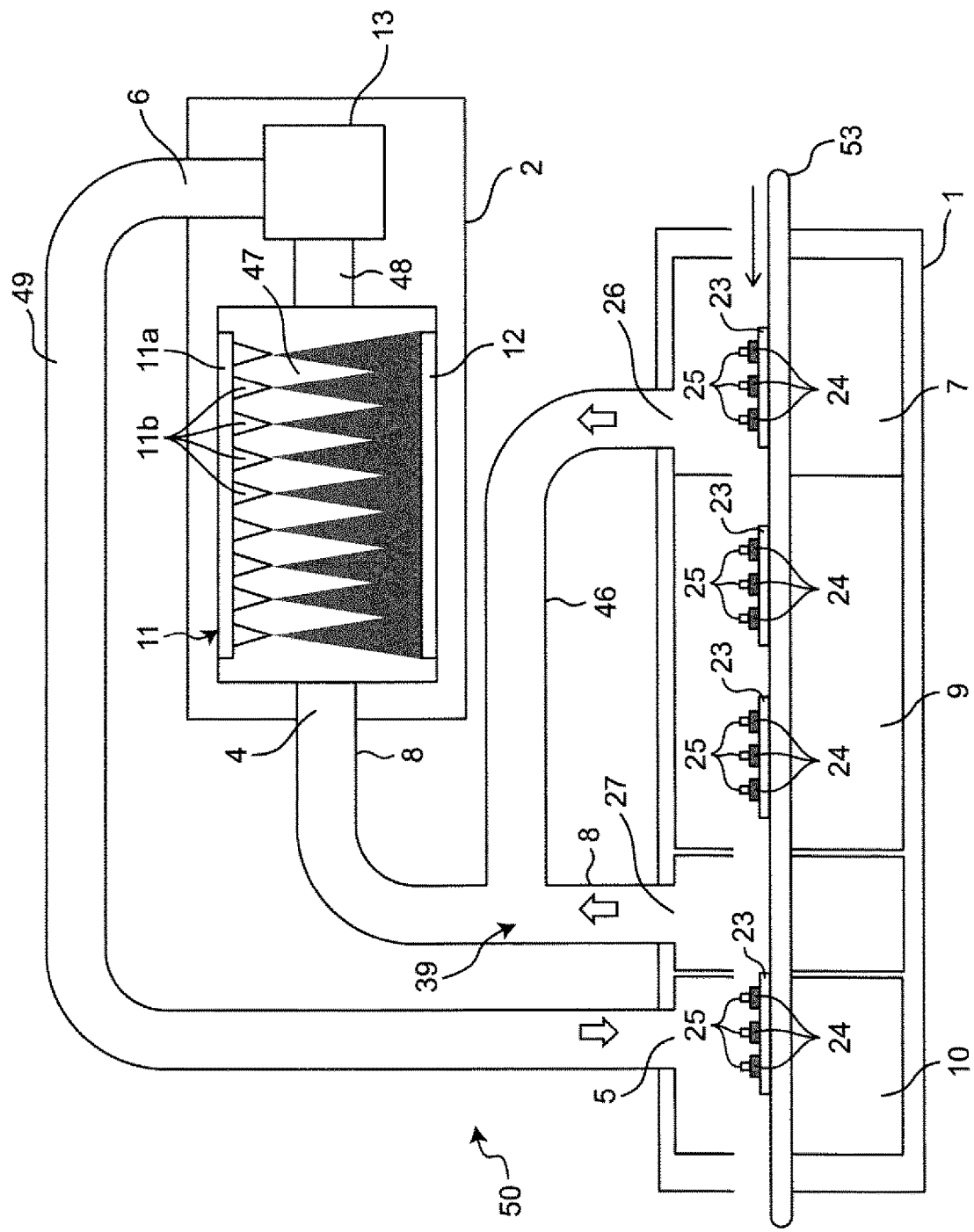
FIG. 7 is a diagram representing a structure of a flux collection apparatus of Second Embodiment of the present disclosure.

FIG. 7 is a diagram showing a flux collection unit of Second Embodiment of the present disclosure. In FIG. 7, the same constituting elements described in FIGS. 8 and 9 and in FIG. 1 and FIG. 6 will be referred to by the same reference numerals, and will not be described again.

In Second Embodiment of the present disclosure, a reflow furnace 1 and an electrostatic-precipitation flux collection unit 2 are connected to each other with pipes 8, 46, and 49. The fan 13 installed in the flux collection unit 2 enables the atmosphere gas inside the reflow furnace 1 to be introduced into the flux collection unit 2 via the pipes 8 and 48 and the flux collection unit 2.

A first furnace-side outlet 26 is provided in a preheat zone 7 that leads to the flux collection unit 2, and a second furnace-side outlet 27 is provided between a cooling zone 10 and a primary heat zone 9, an area of the furnace contaminated most by the flux. The pipe 8 from the second furnace-side outlet 27 is connected to the collection unit-side inlet 4. A pipe 46 leading from the first furnace-side outlet 26 is connected to a middle portion of the pipe 8 to form a mixing section 39.

Preferably, the second furnace-side outlet 27 is installed basically in a portion of the furnace 1 contaminated most by the flux. In the present example, the second furnace-side outlet 27 is installed between the primary heat zone 9 and the cooling zone 10. However, this is merely an example, and the position of the second furnace-side outlet 27 is not limited to this. The furnace-side inlet 5 is installed in the cooling zone 10. This is to avoid the potential risk that the atmosphere gas, when discharged out of the furnace 1 such as into outside air, may cause influx of the same amount of atmosphere gas through the substrate entry and exit openings of the reflow furnace 1, and lower the temperature inside the furnace 1. This is even more problematic when the atmosphere inside the reflow furnace 1 is nitrogen, and ambient air is drawn into the furnace 1. Desirably, the furnace-side inlet 5 is disposed closer to the furnace-side outlet 3. However, this is merely an example, and the position of the furnace-side inlet 5 is not limited to this.

With the foregoing configuration, the atmosphere gas containing the solvent vaporized from the solder paste 24 applied to the circuit board 23 can be drawn out of the preheat zone 7 through the first furnace-side outlet 26, and mixed with the atmosphere gas containing the rosin component vaporized and evaporated from the circuit board 23 and drawn out of the space between the primary heat zone 9 and the cooling zone 10 through the second furnace-side outlet 27. Here, mixing of these atmosphere gases takes place in the mixing section 39 provided upstream of the collection unit-side inlet 4.

Alternatively, the circuit board 23 may be impregnated with a solvent to be mixed in the mixing section 39 of Second Embodiment so that an atmosphere gas containing the solvent vaporized from the circuit board 23 can generate in the preheat zone 7. In this case, there is no need to provide a means to supply solvent such as the spray 22 used in First Embodiment, and the cost of making the apparatus, and the running cost of solvent can be reduced.

A feature of the flux collection unit 2, which collects flux by means of electrostatic precipitation, is that the first furnace-side outlet 26 through which the atmosphere gas is sent out of the preheat zone 7 of the reflow furnace 1, the second furnace-side outlet 27 through which the atmosphere gas is sent out of the reflow furnace 1, and the flux collection unit-side inlet 4 through which the atmosphere gas is introduced into the flux collection unit 2 are connected to one another with pipes via the mixing section 39 provided upstream of the second furnace-side outlet 27, and that the mixing section 39 and the first furnace-side outlet 26 are connected to each other with the pipe 46. With this configuration, the rosin particles 16 contained in the atmosphere gas can mix with vapor of a solvent or with atomized solvent particles 17 in the mixing section 39 provided upstream of the flux collection unit-side inlet 4, and produce mixed particles 18 in the mixing section 39. Because the mixed particles 18 are aggregates of large particle size that can be charged more easily, the flux collection rate of the electrostatic-precipitation collection improves, and, because the rosin particles 16 dissolve into the solvent particles 17, the collected flux has reduced viscosity. In this way, the reflow furnace can remain clean inside, and, at the same time, it becomes easier to clean inside of the flux collection unit.

As is evident, the rosin particles 16, the solvent particles 17, and the mixed particles 18 described in Second Embodiment may each represent a single particle, or a plurality of particles.

Any of the various embodiments or variations above may be appropriately combined such that an embodiment based on such a combination has the effect of each different embodiment or variation. A combination of different embodiments or different Examples, and a combination of an embodiment and an Example may also be made. It is also possible to combine features of different embodiments or different Examples.

The method and the apparatus for collecting flux according to the aspects of the disclosure above enable flux collection in a way that improves the flux collection rate of electrostatic-precipitation collection, and the collected flux has reduced viscosity because of dissolving of rosin particles in solvent particles. In this way, the reflow furnace can remain clean inside, and, at the same time, it becomes easier to clean inside of the flux collection unit. That is, the disclosure can be used to maintain the cleanliness inside a reflow furnace.

What is claimed is:

1. A method for collecting a flux in an atmosphere gas introduced into a flux collection apparatus from inside of a reflow furnace, the method comprising:
   mixing, in a mixing section of the flux collection apparatus, a rosin particle contained in the atmosphere gas with a vapor of a solvent or an atomized solvent particle so as to form a mixed particle before entry into an inlet of a flux collection unit of the flux collection apparatus; and
   collecting, in the flux collection unit of the flux collection apparatus, the mixed particle by electrostatic precipitation from a gas containing the mixed particle,
   wherein:
   the flux collection apparatus is connected to the reflow furnace;
   the flux collection apparatus includes a first pipe, and a second pipe;
   the first pipe connects a first outlet of the reflow furnace to a portion of the second pipe which is upstream of the inlet of the flux collection unit;
   the first outlet of the reflow furnace is an outlet through which the vapor of the solvent or the atomized solvent particle is sent out of a preheat zone of the reflow furnace;
   the second pipe connects a second outlet of the reflow furnace to the inlet of the flux collection unit;
   the second outlet of the reflow furnace is an outlet through which the atmosphere gas is sent out of the reflow furnace into the flux collection unit;
   the mixing section is disposed at an intersection of the first pipe and the second pipe; and the preheat zone of the reflow furnace is a zone to which a circuit board with an applied solder paste containing the solvent is transported.

2. The method according to claim 1, wherein the rosin particle has a particle size distribution with a median that is smaller than a median of a particle size distribution of the mixed particle.

3. The method according to claim 1, wherein the solvent is a solvent that dissolves a rosin component, a polar protic solvent, or a solvent having a flash point that is higher than a temperature of the atmosphere gas containing the rosin particle.

4. A method for collecting a flux in an atmosphere gas introduced into a flux collection apparatus from inside of a reflow furnace, the method comprising:

mixing, in a mixing section of the flux collection apparatus, a rosin particle contained in the atmosphere gas with a vapor of a solvent or an atomized solvent particle so as to form a mixed particle before entry into an inlet of a flux collection unit of the flux collection apparatus; and collecting, in the flux collection unit of the flux collection apparatus, the mixed particle by electrostatic precipitation from a gas containing the mixed particle, wherein:

the flux collection unit is disposed inside the reflow furnace;

the flux collection apparatus includes a first pipe, and a second pipe;

the first pipe connects a first outlet of the reflow furnace to a portion of the second pipe which is upstream of the inlet of the flux collection unit;

the first outlet of the reflow furnace is an outlet through which the vapor of the solvent or the atomized solvent particle is sent out of a preheat zone of the reflow furnace;

the second pipe connects a second outlet of the reflow furnace to the inlet of the flux collection unit;

the second outlet of the reflow furnace is an outlet through which the atmosphere gas is sent out of the reflow furnace into the flux collection unit;

the mixing section is disposed at an intersection of the first pipe and the second pipe; and the preheat zone of the reflow furnace is a zone to which a circuit board impregnated with the solvent is transported.

5. A flux collection apparatus comprising:

an electrostatic-precipitation flux collection unit;

a first pipe;

a second pipe; and a mixing section configured to mix a vapor of a solvent or an atomized solvent particle with a rosin particle of an atmosphere gas to form a mixed particle, wherein:

the first pipe is configured to connect a first outlet of a reflow furnace to a portion of the second pipe which is upstream of an inlet of the electrostatic-precipitation flux collection unit;

the first pipe is configured to send the vapor of the solvent or the atomized solvent particle from a preheat zone of the reflow furnace to the mixing section;

the second pipe is configured to connect a second outlet of the reflow furnace to the inlet of the electrostatic-precipitation flux collection unit;

the second pipe is configured to send the atmosphere gas from the reflow furnace into the electrostatic-precipitation flux collection unit; and the mixing section is disposed at an intersection of the first pipe and the second pipe.

6. The flux collection apparatus according to claim 5, wherein the mixing section is configured to spray the solvent into the atmosphere.

7. The flux collection apparatus according to claim 5, wherein the rosin particle has a particle size distribution with a median that is smaller than a median of a particle size distribution of the mixed particle.

8. A reflow furnace comprising the flux collection apparatus of claim 5.

9. The method according to claim 4, wherein the rosin particle has a particle size distribution with a median that is smaller than a median of a particle size distribution of the mixed particle.

10. The method according to claim 4, wherein the solvent is a solvent that dissolves a rosin component, a polar protic solvent, or a solvent having a flash point that is higher than a temperature of the atmosphere gas containing the rosin particle.

* * * * *